(12) United States Patent
Trivedi et al.

(10) Patent No.: US 10,796,212 B2
(45) Date of Patent: Oct. 6, 2020

(54) ORIENTATION-AGNOSTIC METHOD TO INTERFACE TO PRINTED MEMORY LABEL

(71) Applicant: XEROX CORPORATION, Norwalk, CT (US)

(72) Inventors: Amit Trivedi, Webster, NY (US); Kamran Uz Zaman, Webster, NY (US); Karl Edwin Kurz, Rochester, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 16/150,178

(22) Filed: Oct. 2, 2018

(65) Prior Publication Data

US 2020/0104662 A1      Apr. 2, 2020

(51) Int. Cl.
*G06K 7/06*      (2006.01)
*G06K 19/067*   (2006.01)
(Continued)

(52) U.S. Cl.
CPC ......... *G06K 19/067* (2013.01); *G06K 7/0021* (2013.01); *G06K 7/015* (2013.01);
(Continued)

(58) Field of Classification Search
CPC ......... H01L 2924/00; H01L 2924/0002; G11C 11/22; Y10T 29/42; G06F 21/85;
(Continued)

(56) References Cited

U.S. PATENT DOCUMENTS

| 5,349,401 A | 9/1994 | Bryant |
| 7,374,954 B2 * | 5/2008 | Kang ............... G11C 11/22 |
| | | 438/240 |

(Continued)

FOREIGN PATENT DOCUMENTS

| EP | 1014167 A3 | 10/2000 |
| JP | 1014167 A2 | 6/2000 |

OTHER PUBLICATIONS

Author Unknown, "Xerox Launches Printed Memory Products to Combat Counterfeiting," News Release, Xerox Corporation, Sep. 15, 2015, 2 pages.

(Continued)

*Primary Examiner* — Thien M Le
(74) *Attorney, Agent, or Firm* — MH2 Technology Law Group LLP (57) ABSTRACT

An electronic system for identifying an article can include a printed memory having a plurality of contact pads electrically coupled to a plurality of landing pads positioned on a first side of a printed circuit board (PCB) substrate. The plurality of landing pads can be electrically coupled to a plurality of endless, concentric contact lines positioned on a second side of the PCB substrate through a plurality of vias that extend through a thickness of the PCB substrate and a plurality of traces that electrically couple the plurality of vias with the plurality of landing pads. To perform a memory operation on the printed memory, contact probes of a reader are physically and electrically contacted with the plurality of concentric contact lines. In some implementations, the memory operation can be performed on the printed memory irrespective of a rotational orientation of the printed memory relative to the reader.

20 Claims, 5 Drawing Sheets

(51) Int. Cl.
   *G06K 7/00*      (2006.01)
   *G06K 7/015*     (2006.01)
   *G11B 9/02*      (2006.01)
   *G06K 15/14*     (2006.01)
   *G06K 15/02*     (2006.01)

(52) U.S. Cl.
   CPC ........... *G06K 15/021* (2013.01); *G06K 15/14* (2013.01); *G06K 2215/0097* (2013.01); *G11B 9/02* (2013.01)

(58) Field of Classification Search
   CPC .... G06F 9/223; G06K 7/0026; G06K 9/0002; G06K 9/00053
   See application file for complete search history.

(56) References Cited

U.S. PATENT DOCUMENTS

| | | | |
|---|---|---|---|
| 7,615,970 B1* | 11/2009 | Gimlan | H01G 5/012 320/166 |
| 9,000,598 B1 | 4/2015 | Hamby et al. | |
| 9,412,705 B2* | 8/2016 | Karlsson | H01L 43/12 |
| 9,928,893 B1 | 3/2018 | Fowler | |
| 9,934,415 B1 | 4/2018 | Fowler et al. | |
| 2006/0137905 A1* | 6/2006 | Kariya | H05K 1/162 174/255 |
| 2006/0221735 A1* | 10/2006 | Matsumoto | G11C 29/006 365/201 |
| 2007/0243678 A1* | 10/2007 | Newsome | B82Y 10/00 438/238 |
| 2014/0084416 A1* | 3/2014 | Kang | H01L 25/105 257/532 |
| 2015/0263250 A1 | 9/2015 | Oka | |
| 2018/0254280 A1 | 9/2018 | Blair et al. | |
| 2019/0163945 A1* | 5/2019 | Kim | G06K 9/0002 |
| 2019/0363471 A1* | 11/2019 | Doody | H01R 13/2407 |
| 2020/0027887 A1* | 1/2020 | Herko | G11C 11/221 |

OTHER PUBLICATIONS

Author Unknown, "Xerox Printed Memory with Cryptographic Security," Information Brochure, Xerox Corporation, 2015, 4 pages.
Doody et al., "Printed Memory Grid Connector," U.S. Appl. No. 15/498,219, filed Apr. 26, 2017.
Extended European Search Report dated Mar. 19, 2020 in corresponding European Application No. 19200660.9, 10 pages.

* cited by examiner

ORIENTATION-AGNOSTIC METHOD TO INTERFACE TO PRINTED MEMORY LABEL

TECHNICAL FIELD

The present teachings relate to the field of memory devices and product marking, for example, products including a tag or label for authentication and/or inventory control and, more particularly, to readers and scanners for reading and/or writing data from/to a product marked with an electronic memory, tag, or label.

BACKGROUND

Xerox Printed Memory is a highly secure printed label including rewritable memory. In one exemplary use, the labels may be used for authentication to determine whether a product is authentic or genuine to prevent counterfeiting. For example, the printed memory may be attached as a label onto a consumable product, supply, shipment packaging, consumer product, document, customer-replaceable product, etc. Data from the printed memory may be read and compared to an expected result or value. If the value read from the printed memory by a memory reader matches the expected value, circuitry within the memory reader can identify the printed memory (and thus the item to which it is attached) as authentic. In some uses, identification of the product as authentic may be required before the product to which the printed memory is attached is allowed to function, in which case the memory reader, or a host device that incorporates the memory reader as a subsystem, can allow or enable functionality of the product. If the value read from the printed memory does not match the expected value, the circuitry within the reader or host device can designate the printed memory, and thus the item to which the printed memory is attached, as not authentic, for example, as counterfeit, gray market, not manufactured by an original equipment manufacturer (OEM) or a licensed manufacturer (i.e., non-OEM), etc. In some uses, the memory reader or host device can disable functionality of the product if the label attached to the product is identified as not authentic.

In another implementation, Xerox Printed Memory may be used to track a product through a manufacturing process and/or a supply chain. The labels can be programmed to mark individual items with a unique electronic identifier that may be verified with a memory reading device. Other uses for Xerox Printed Memory are contemplated including, but not limited to, smart consumables where an object is associated with data that is later used by a base unit to improve or optimize performance, consumption records where bulk usage of a product supply is tracked, tracking of items or people outside of a manufacturing environment, etc.

A Xerox Printed Memory includes a layer of ferroelectric or ferrite material (i.e., a ferroelectric layer) positioned between a plurality of wiring lines (e.g., word lines and bit lines). A region of the ferroelectric layer situated between each bit line and word line forms a memory cell. The memory may be written with one of two digital memory states by applying a suitable write voltage to the wiring lines. The memory state may be read by applying a suitable read voltage to the wiring lines through contact pads.

Various manufacturing processes may be used to form the ferroelectric material. Depending on the manufacturing process used, the printed memory device will display particular electrical characteristics. For example, for a given read voltage, different compositions of the ferroelectric layer return different output values. The manufacture and composition of the memory itself is difficult to counterfeit and provides secure and reliable anti-counterfeiting measures and reliable product tracking.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation of the present teachings, a memory device include a printed memory having a substrate, a plurality of contact pads overlying the substrate, a plurality of wiring lines electrically coupled to the plurality of contact pads, and ferroelectric layer overlying the substrate. The memory device further includes a printed circuit having a plurality of concentric, endless contact lines electrically coupled to the plurality of contact pads.

Optionally, the plurality of wiring lines can include at least one bit line and a plurality of word lines. At least a portion of the ferroelectric layer can be positioned between the at least one bit line and the plurality of word lines, where the ferroelectric layer positioned between the at least one bit line and each word line of the plurality of word lines forms a memory cell, and each memory cell is individually addressable through two of the concentric, endless contact lines.

The plurality of concentric, endless contact lines can be a plurality of circular concentric, endless contact lines. Further, the printed circuit can be positioned on a first side of a dielectric substrate and a second side of the dielectric substrate. Additionally, the plurality of contact pads can be electrically coupled to a plurality of landing pads on the first side of the dielectric substrate. The plurality of concentric, endless contact lines can be electrically coupled to the plurality of landing pads with a plurality of vias that extend through a thickness of the dielectric substrate and a plurality of traces positioned on the first side of the dielectric substrate.

In another implementation, an electronic system for identifying an article, includes a printed memory having a substrate, a plurality of contact pads overlying the substrate, a plurality of wiring lines electrically coupled to the plurality of contact pads, and ferroelectric layer overlying the substrate. The electronic system further includes a printed circuit having a plurality of concentric, endless contact lines electrically coupled to the plurality of contact pads, and a reader configured to perform a memory operation on the printed memory. The reader includes a read head having a plurality of contact probes for physically and electrically contacting the plurality of concentric, endless contact lines.

Optionally, the plurality of concentric, endless contact lines can be a plurality of circular concentric, endless contact lines. The electronic system can further include a printed circuit board (PCB) substrate having a first side and second side opposite the first side, wherein the plurality of concentric, endless contact pads are positioned on the second side, and a plurality of landing pads positioned on the first side of the PCB substrate, wherein the plurality of contact pads are physically and electrically coupled to the plurality of landing pads.

Further optionally, the electronic system can further include a plurality of vias that extend through a thickness of the PCB substrate, and a plurality of traces electrically coupled to the plurality of landing pads and the plurality of vias, wherein the plurality of concentric, endless contact lines can be electrically coupled to the plurality of landing pads by the plurality of vias and the plurality of traces.

The reader can further include a contoured casing configured to match a shape of the article, where the read head is optionally mounted to the casing. During a memory operation on the printed memory, a first center of the PCB substrate can be axially aligned with a second center of the read head.

The electronic system can further include a plurality of dimples positioned on one of the PCB substrate and the read head and a plurality of detents positioned on the other of the PCB substrate and the read head, wherein the plurality of dimples and the plurality of detents are configured for the axially aligning of the first center of the PCB substrate with the second center of the read head.

The electronic system can further include a first magnet positioned at the first center of the PCB substrate and a second magnet positioned at the second center of the read head, wherein the first magnet and the second magnet are configured for the axially aligning of the first center of the PCB substrate with the second center of the read head.

The plurality of concentric, endless contact lines can be a plurality of circular concentric, endless contact lines, and the electronic system can be configured to perform a memory operation using the read head irrespective of a rotational orientation of the read head relative to the printed memory around the second center of the read head.

In another implementation of the present teachings, a method of performing a memory operation on a printed memory includes physically and electrically contacting a plurality of endless, concentric contact lines with a plurality of contact probes of a reader, initiating the memory operation using the reader, and placing a voltage across a bit line and a word line of the printed memory using the reader to perform the memory operation on a ferroelectric layer positioned between the bit line and the word line. An electric charge applied to the printed memory by the reader extends through an electrical pathway formed by the plurality of contact probes, the plurality of endless, concentric contact lines, a plurality of vias electrically coupled to the plurality of endless, concentric contact lines, a plurality of traces electrically coupled to the plurality of vias, a plurality of landing pads electrically coupled to the plurality of traces, a plurality of contact pads of the printed memory, the bit line, and the word line.

Optionally, the plurality of vias can extend through a thickness of a printed circuit board (PCB) substrate, the plurality of landing pads can be positioned on a first side of the PCB substrate, and the plurality of endless, concentric contact lines can be positioned on a second side of the PCB substrate. The plurality of contact probes can be configured to physically contact the plurality of endless, concentric contact lines at any rotational orientation relative to the printed memory to result in a successful memory operation being performed on the printed memory by the reader.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

As used herein, "data" refers to any type of information, signal, or other result that is obtained from or sent to an electrical device such as a memory device, an integrated circuit, or another electrical device, or any information obtained from monitoring, interrogating, querying, or measuring, etc., an electrical device. The term "data" includes digital data, analog data, voltage values, current values, resistance values, vector values, scalar values, and/or flux values.

Figure 1:
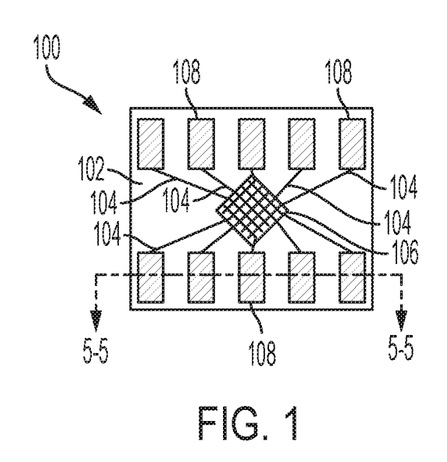
FIG. 1 is a plan view of a printed memory such as a Xerox Printed Memory.

An example of a memory device 100, for example, a printed memory (i.e., printed memory device) 100 such as a Xerox Printed Memory 100 is depicted in the plan view of FIG. 1. The structure and function of the Xerox Printed Memory 100 is known and is only briefly discussed herein. The FIG. 1 printed memory 100 includes a substrate 102, for example, a flexible dielectric substrate 102, such as a flexible polymer substrate, that may include an adhesive backing layer to aid in attachment of the printed memory 100 to a surface of a product, a plurality of wiring lines (e.g., word lines and bit lines) 104 and a ferroelectric layer 106 directly interposed or positioned between the word lines and the bit lines. A memory cell that stores the logic bit or logic state is provided by and within the ferroelectric layer 106 at the physical location that is interposed between the intersection of each word line and bit line. It will thus be appreciated that the word lines and bit lines do not physically contact each other, but are physically separated by the ferroelectric layer 106. The printed memory 100 depicted in FIG. 1 includes ten wiring lines 104 (five word lines and five bit lines), and thus the FIG. 1 device includes 25 memory cells and may thus store 25 bits of information. Each wiring line 104 terminates in a contact pad 108. Each memory cell can be individually addressed through two of the contact pads (i.e., through one word line and one bit line). The plurality of contact pads 108 may be arranged in a rectangular shape in two or more rows and columns as depicted, or they may be arranged in a single column. It will be appreciated that a Xerox Printed Memory may include other structures that are not described or depicted for simplicity, while various depicted structures may be removed or modified. Each memory cell of the printed memory 100 may be read by applying a suitable read voltage to two of the wiring lines 104 (i.e., to one word line and one bit line) and measuring an electrical response. To apply the read voltage, the plurality of contact pads 108 can be physically and/or electrically contacted with probe contacts of a reader. A voltage is applied across the contact pads 108 through probe contacts, and the resulting response is measured. Each memory cell may be individually addressed during a read cycle or write cycle (hereinafter, a memory operation), and two or more, or all, of the memory cells in the memory array may be read or written simultaneously or serially.

The contact pads 108 of the printed memory 100 and other electrical devices can be formed using a carbon-impregnated composite, electrically conductive inks such as silver nanoparticle ink, or one or more other suitable materials. These contact pads 108 can become scratched and degrade from repeated physical contact with, for example, electrical probes of a reader. Further, when direct physical contact is made between the reader and the printed memory 100, the reader must be correctly oriented with the printed memory 100.

An implementation of the present teachings provides an interface between the reader and the contact pads 108 of the printed memory 100. The interface eliminates the need to physically contact the reader with the contact pads 108, thus decreasing wear from repeated contact with the contact pads 108. Further, the interface is agnostic with respect to rotational orientation of the reader with the contact pads 108 of the printed memory 100. Thus the printed memory 100 can be electrically addressed (i.e., written to or read from) in any position regardless or irrespective of the rotational orientation of the reader relative to the printed memory 100.

Figure 2:
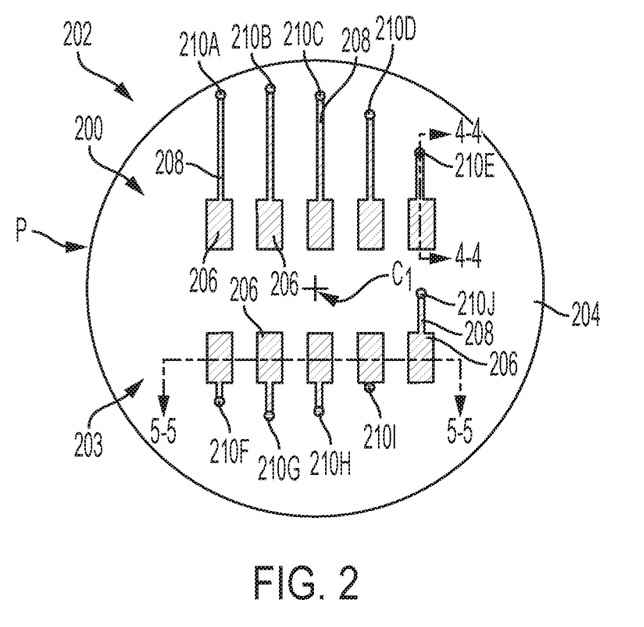
FIG. 2 is a plan view of a portion of a printed circuit positioned on a first side of a printed circuit board (PCB) substrate.
Figure 3:
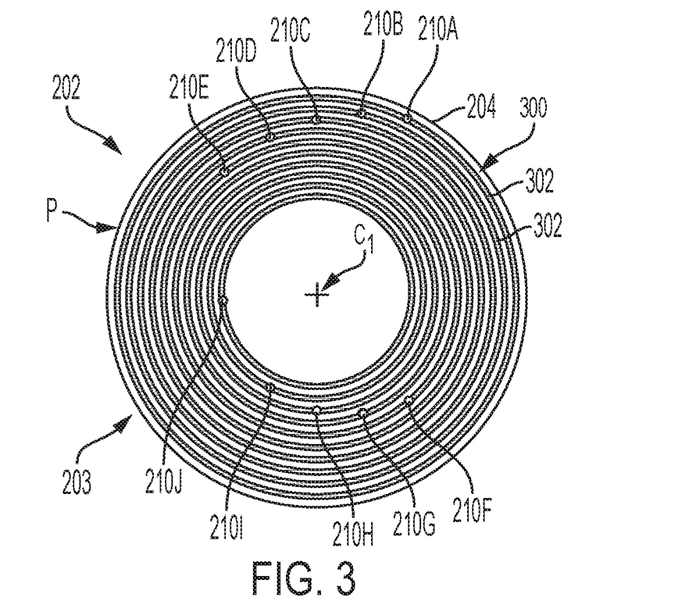
FIG. 3 is a plan view of another portion of the printed circuit formed on a second side of the PCB substrate, where the second side is opposite the first side.

FIG. 2 is a plan view depicting a first side 200 of a printed circuit board (PCB) 202 including a printed circuit 203, and FIG. 3 is a plan view depicting a second side 300 of the PCB 202, where the second side 300 is opposite the first side 200. While the PCB 202 is depicted as having a circular perimeter "P," which may provide various advantages as discussed below, it will be appreciated that PCB's having a perimeter P shape other than circular are contemplated. The PCB 202 may be formed on and within a PCB substrate 204, where the PCB substrate 204 is an electrical insulator (e.g., an electrical dielectric). The first side 200 includes a plurality of landing pads 206, a plurality of traces 208, and a plurality of vias 210, where each of these structures is electrically conductive. In this implementation, each landing pad 206 is electrically connected to (i.e., electrically coupled with) one of the vias 210 by one of the traces 208. For purposes of explanation, the plurality of vias 210 are each uniquely identified in FIGS. 2 and 3 with a reference number 210A-210J. Further, each via 210 of the plurality of vias 210A-210J is located at a different distance from a focus or center "$C_1$" of the PCB 202, and extend through a thickness of the PCB substrate 204 from the first side 200 to the second side 300. The landing pads 206 and traces 208 can be or include a single metal layer or two or more layers. The plurality of vias 210 extend through the PCB substrate 204 from the first side 200 to the second side 300. It will be appreciated that the traces 208 may be formed over the vias 210 such that the vias 210 are not visible from the first side 200 of the PCB 202, in which case the vias 210 are depicted in FIG. 2 as being visible for purposes of explanation.

The landing pads 206 can be designed to be of similar size and shape as the contact pads 108 of the printed memory 100. Further, the number of landing pads 206 can be the same as the number of contact pads 108 which, for the present implementation, includes ten contact pads 108 and ten landing pads 206, although more or less than ten of each is contemplated. During use, the contact pads 108 of the printed memory 100 and the landing pads 206 of the PCB 202 are electrically coupled as described below.

FIG. 3 depicts the obverse side of the FIG. 2 depiction, where the FIG. 2 structure is rotated 180° horizontally with respect to the page to result in the FIG. 3 depiction. The structure of FIG. 3 includes a plurality of endless electrically conductive contact lines 302, where each contact line 302 is physically spaced and electrically isolated from every other contact line 302. For purposes of the present teachings, an "endless" electrically conductive contact line is one that is continuous and has no non-conductive gap along the contact line, and encloses a dielectric region. In FIG. 3, the plurality of contact lines 302 provided on the circular PCB substrate 204 are formed as a plurality of concentric rings 302.

As depicted in FIG. 3, each contact line 302 is electrically connected to (i.e., electrically coupled with) one of the vias 210. Thus the printed circuit 203 includes an electrical pathway that is established between each contact line 302, through one of the vias 210, through one of the traces 208, and to one of the landing pads 206. It will be appreciated that the plurality of contact lines 302 may be formed over the plurality of vias 210 such that the vias 210 are not visible from the second side 300 of the PCB 202, in which case the vias 210 are depicted in FIG. 3 as being visible for purposes of explanation.

The structure of FIGS. 2 and 3 can be manufactured by one of ordinary skill in the art using electronic fabrication techniques known in the art, such as printed circuit board technology. It will be appreciated that an actual PCB can include other features not discussed or depicted for simplicity, while other depicted structures can be removed or modified. Further, the example implementation depicted in the figures includes ten contact pads 108, ten landing pads 206, ten traces 208, ten vias 210, and ten contact lines 302, although implementations including more or fewer than ten of each structure are contemplated.

Figure 4:
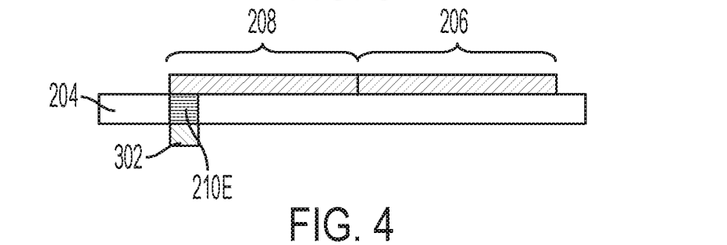
FIG. 4 is a cross section along 4-4 of FIG. 2.

FIG. 4 is a cross section along 4-4 of FIG. 2 through via 210E. FIG. 4 has been magnified from the scale of FIG. 2 for clarity.

Figure 5:
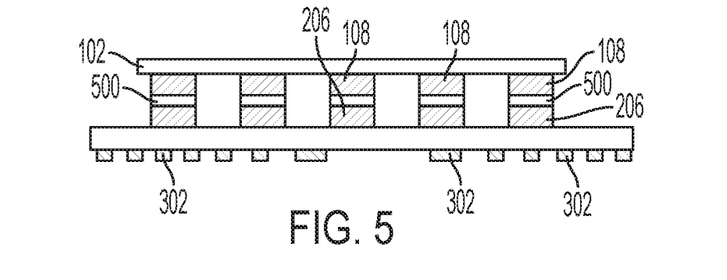
FIG. 5 is a cross section along 5-5 of FIG. 2.

FIG. 5 is a cross section along 5-5 of FIG. 2 after electrically coupling the contact pads 108 of the printed memory 100 to the landing pads 206 of the PCB 202 using an electrical conductor 500. FIG. 5 has been magnified from the scale of FIG. 2 for clarity. The electrical conductor 500 can be or include any suitable material, for example, solder, an electrically conductive paste, or another electrical conductor. Thus, once the contact pads 108 of the printed memory 100 have been electrically coupled to the landing pads 206 using the electrical conductor 500, an electrical pathway is established between the plurality of contact pads 108 and the plurality of contact lines 302.

Figure 6:
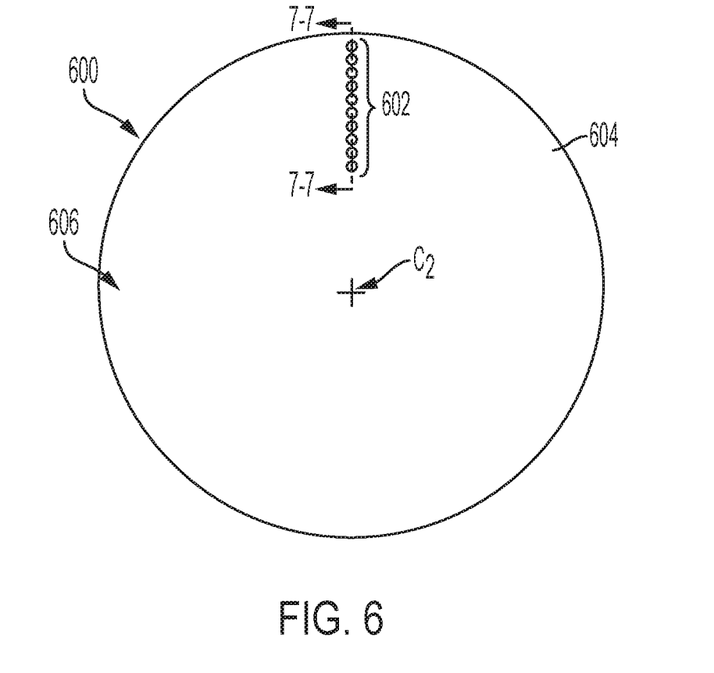
FIG. 6 is a plan view of a read head of a printed memory reader.
Figure 7:
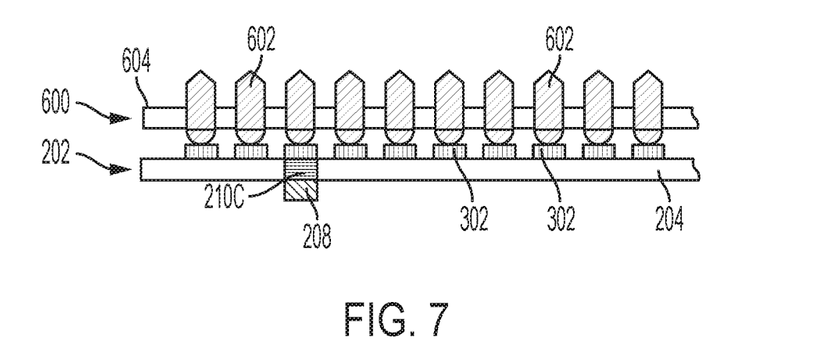
FIG. 7 is a cross section along 7-7 of FIG. 6.

FIG. 6 depicts a read head 600 that may be part of a reader. The read head 600 is configured to perform a memory operation on the printed memory 100 using the printed circuit 203 of the PCB 202. The reader may be a standalone fixed or portable reader, or the reader may be a subcomponent of another electronic device such as, without limitation, an electronic device such as a printer, a copier, a coffeemaker, etc. The read head 600 includes a plurality of electrically conductive contact probes 602 that are positioned to protrude from a supporting substrate 604 such as a read head disk. The contact probes 602 can extend through the supporting substrate 604 as depicted in FIG. 7, and electrically connect with memory operation circuitry such as read and/or write circuitry (not individually depicted for simplicity). While FIGS. 6 and 7 depict the contact probes 602 laterally aligned on a surface 606 of the read head disk 604, the contact probes 602 can be positioned at other locations around the read head disk 604 such that they are not laterally aligned but are spaced and distributed around a focus or center "$C_2$" of the read head disk 604. It will be appreciated that each contact probe 602 is positioned at a different radius away from the center $C_2$ of the read head disk 604, although redundant contact probes at identical radii from $C_2$ but at different locations on the read head disk 604 are contemplated.

FIG. 6 depicts ten contact probes 602 that are configured to physically contact the ten contact lines 302 depicted in FIG. 3, thereby establishing electrical contact with the ten contact pads 108 of the printed memory 100. FIG. 7 is a cross section along 7-7 of FIG. 6, with the contact probes 602 physically and electrically contacting the plurality of contact lines 302 of the PCB 202. In the FIG. 7, via 210C and the associated trace 208 are, by chance, located at the depicted position of the 7-7 cross section.

Referring to FIGS. 3, 6, and 7, it will be appreciated that with $C_1$ and $C_2$ axially aligned with each other (where the axial alignment allows some lateral offset within an allowable tolerance), when the second side 300 of the PCB 202 faces and is parallel with the surface 606 of the read head 600, any rotational orientation of the PCB 202 relative to the read head 600 about $C_1$ and $C_2$ is sufficient to establish electrical contact between the contact probes 602 and the contact lines 302. Additionally, because the contact lines 302 are electrically coupled with the contact pads 108 of the printed memory 100, any rotational orientation of the printed memory and the read head 600 is sufficient to establish electrical contact between the read head 600 and the printed memory 100. Thus each memory cell at the intersection of one of the bit lines and one of the word lines can be individually addressed through physical contact with two of the contact lines 302, a first of which is electrically coupled to one of the word lines and a second of which is electrically coupled to one of the bit lines.

Thus, it will be appreciated that when the plurality contact probes 602 of the read head 600 of the reader 800 physically and electrically contact the plurality of endless, concentric contact lines 302, an electrical pathway is established between the reader 800 and the printed memory 100. During a memory operation on the printed memory 100 using the reader 800, an electric charge is applied to the printed memory 100 through the electrical pathway. The electrical pathway is at least partially formed by, and extends through, the plurality of contact probes 602, the plurality of endless, concentric contact lines 302, the plurality of vias 210 that are electrically coupled to the plurality of endless, concentric contact lines 302, the plurality of traces 208 that are electrically coupled to the plurality of vias 210, and the plurality of landing pads 206 that are electrically coupled to the plurality of traces 208, the plurality of contact pads 108 using the electrical conductor 500, and the wiring lines 104 (e.g., at least one bit line and a plurality of word lines). The electrical pathway further extends from the contact pads 108, to the plurality of wiring lines 104, and to the ferroelectric layer 106 that is positioned between the wiring lines 104 (i.e., between the word lines and the bit lines). It will be appreciated that the plurality of contact probes 602 can physically contact the plurality of endless, concentric contact lines 302 at any rotational orientation relative to the printed memory 100 to result in a successful memory operation being performed on the printed memory 100 by the reader 800.

Figure 8:
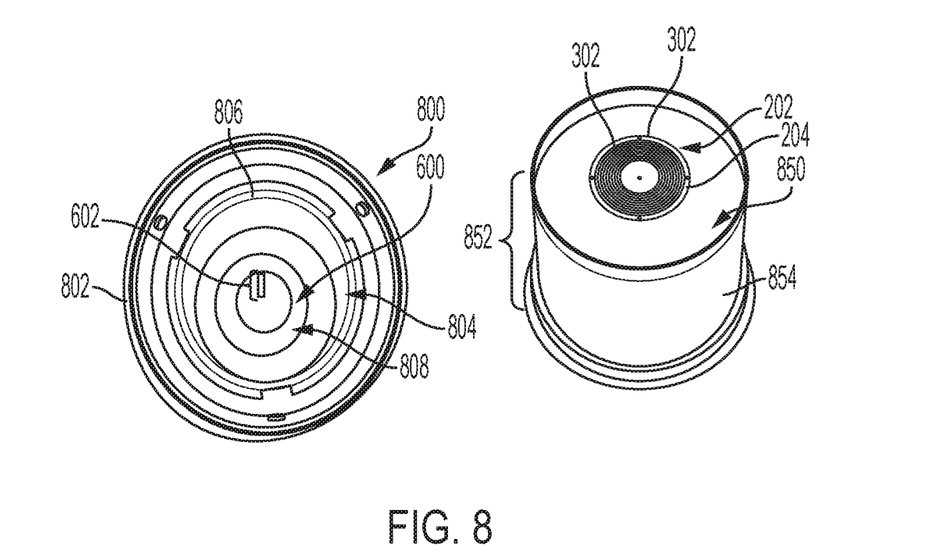
FIG. 8 are perspective depictions of a reader and an article including the printed memory.

Various techniques for establishing axial alignment between $C_1$ of the PCB 202 relative to $C_2$ of the read head 600 are contemplated. For example, FIG. 8, depicts a reader 800 including a casing 802 having a concave recess 804 defined at least in part by a sidewall 806 that intersects a reader surface 808, where the read head 600 is mounted to the reader surface 808 of the casing 802. FIG. 8 further depicts the PCB 202 mounted to a surface 850 of a convex portion 852 of an article 854. During a memory operation on the printed memory 100, the convex portion 852 of the article 854 is inserted into the recess 804 of the reader 800 until the contact probes 602 of the read head 600 physically and electrically contact the contact lines 302 of the PCB 202. It will be appreciated that the contact probes 602 will physically and electrically contact the contact lines 302 in any rotational orientation about $C_1$ of the read head 600 relative to $C_2$ of the PCB 202, through 360° of rotation. Similarly, a memory operation can be performed using the read head 600 irrespective of the rotational orientation around $C_2$ of the read head 600 relative to the printed memory 100 (FIG. 1), from 0° through 360°. Thus, in this implementation, the casing 802 of the reader 800 is shaped or contoured to fit or match the shape of the article 854 to which the PCB 202 and the printed memory 100 is attached. During a memory operation on the printed memory 100, the casing 802 is placed onto or over the article such that physical and electrical contact is established between the read head 600 and the PCB 202, similar to that depicted in FIG. 7, and thus between the reader 800 and the printed memory 100.

Additionally, during a memory operation, the contact pads 108 of the printed memory 100 are not physically contacted with the contact probes 602 of the reader 800. The contact lines 302 of the PCB 202 can be manufactured from a material that is more resistant to damage than the contact pads 108 of the printed memory. For example, while the contact pads 108 are conventionally formed from a carbon-impregnated composite or an electrically conductive ink such as a silver nanoparticle ink that can be easily scratched and damaged from repeated contact by a reader, the contact lines 302 can be manufactured from a more resilient material such as copper, aluminum, or another suitable material.

Figure 9:
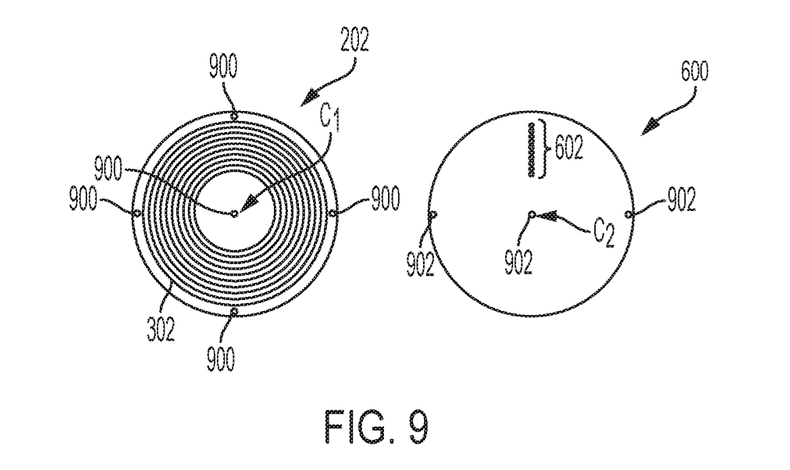
FIG. 9 is a plan view of a portion of a printed circuit and a read head according to another implementation of the present teachings.

FIG. 9 depicts another technique for aligning the read head 600 with the PCB 202, for example, so that $C_1$ is axially aligned with $C_2$. This implementation employs one or more detents 900 and one or more dimples 902 to align the read head 600 with the PCB 202. While the figures depict the detents 900 positioned on the PCB 202 and the dimples 902 positioned on the read head 600 for purposes of explanation, it will be appreciated that the detents 900 and dimples 902 may be positioned on either or both of the PCB 202 and the read head 600. The detents 900 on PCB 202 can align with dimples 902 on PCB 202 by first having PCB 202 be physically contacted, mated, and/or aligned with the center of PCB 600 followed by rotating either PCB 202 or PCB 600 clockwise or counter clockwise. For a user, the rotation can be performed until the user detects a tactile sensation of resistance during rotation which would indicate the detent and dimples are aligned. For an automatic reader, the rotation can be completed when the resistance is detected by the reader electronically.

Figure 10:
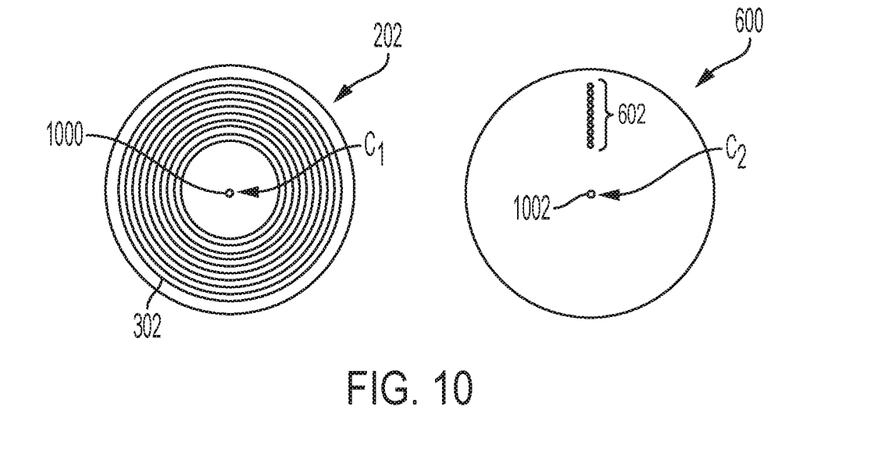
FIG. 10 is a plan view of a portion of a printed circuit and a read head according to another implementation of the present teachings.

FIG. 10 depicts another technique for aligning the read head 600 with the PCB 202, for example, so that $C_1$ is axially aligned with $C_2$. This implementation employs a first magnet 1000 on the PCB 202, for example, at the center $C_1$ of the PCB 202, and a second magnet 1002 on the read head 600, for example, at the center $C_2$ of the read head 600. The magnet 1000 on PCB 202 will be opposite magnetic polarity to that of magnet 1002 on PCB 600. The alignment of magnet 1000 on PCB 202 and magnet 1002 on PCB 600 can be detected when PCB 202 is physically contacted, mated, and/or aligned with PCB 600 with the objective of aligning centers of both PCB 202 and PCB 600. The magnet 1000 on PCB 202 will be drawn by magnetic force towards magnet 1002 on PCB 600 to align PCB 202 with PCB 600. For a user, when magnet 1000 and magnet 1002 are aligned, thus aligning PCB 202 and PCB 600, a tactile sensation of resistance will be detected when the user attempts to move the PCB's 202, 600 apart. For an automatic reader, the resistance can be detected electronically.

Figure 11:
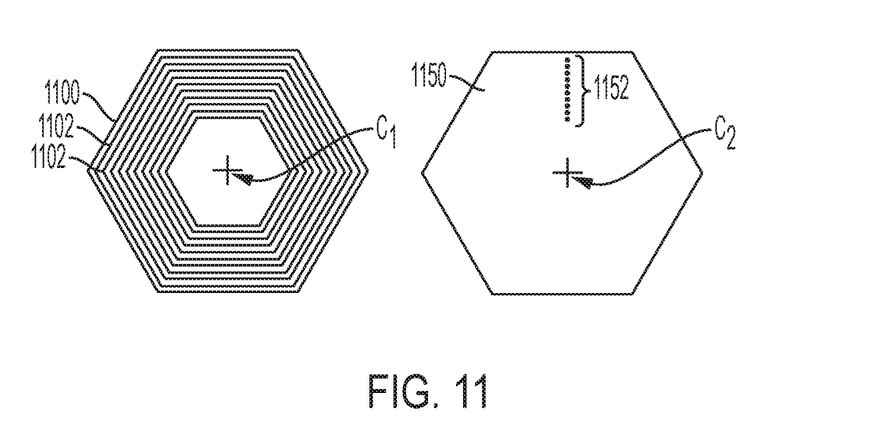
FIG. 11 is a plan view of a portion of a printed circuit and a read head according to another implementation of the present teachings.

As discussed above, with a plurality of circular concentric, endless contact lines 302, a memory operation can be performed on the printed memory 100 by the reader 800 continuously through any position (e.g., through any degree of rotation) from 0° through 360° of rotation of the contact probes 602 relative to the contact lines 302 about the center points $C_1$ and $C_2$. However, some articles to which the PCB 202 is attached my lend themselves to other shapes of contact lines, for example, a PCB and contact lines formed with other shapes such as oval, as a smooth polygon, or with three or more sides (e.g., triangular, square, rectangular, pentagonal, star-shaped), or from three to twenty sides, rather than having a circular shape. While a different shape may decrease the number of read head positions available for a memory operation on the printed memory, the non-circular shape may be preferred in some uses. For example, FIG. 11 depicts a hexagonal PCB 1100 with endless, concentric contact lines 1102 formed as hexagons. FIG. 11 further depicts a read head 1150 having contact probes 1152 that are spaced to provide physical and electrical contact to each of the contact lines 1102. The configuration of FIG. 11 allows the read head 1150 to perform a memory operation with the printed memory 100 in any one of six different rotational positions about $C_1$ relative to the PCB 1100.

Referring back to FIGS. 1 and 2, it is contemplated that, for a circular PCB 202, a diameter of the PCB 202 can be greater than or equal to a diagonal measurement of the substrate 102 of the printed memory 100 so that the outer perimeter of the substrate 102 (and thus the outer perimeter of the printed memory 100) fits onto the first side 200 of the PCB 202. Referring to FIG. 1, the substrate 102 of the printed memory 100 can have a width of from about 10 millimeters (mm) to about 20 mm, for example from about 13.5 mm to about 14.5 mm, and a height of from about 0.05 mm to about 0.3 mm, for example from about 0.1 mm to about 0.2 mm. The PCB substrate 204 can have a diameter of about 15 mm to about 30 mm, or from about 15 mm or larger, or from about 17 mm or larger. Referring to FIG. 3, each contact line 302 can have a width of from about 75 micrometers (μm) to about 200 μm, for example from about 101 μm to about 178 μm. Referring to FIG. 6, each contact probe 602 can have a width of from about 75 μm to about 200 μm, for example from about 101 μm to about 130 μm. Other dimensions are contemplated depending on the technology used and the specific application to which the present teachings are applied.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A memory device, comprising:
a printed memory comprising a substrate, a plurality of contact pads overlying the substrate, a plurality of wiring lines electrically coupled to the plurality of contact pads, and ferroelectric layer overlying the substrate; and
a printed circuit comprising a plurality of concentric, endless contact lines electrically coupled to the plurality of contact pads wherein, at least in plan view, each of the plurality of concentric, endless contact lines encloses an electrical insulator region.

2. The memory device of claim 1, wherein:
the plurality of wiring lines comprises at least one bit line and a plurality of word lines;
at least a portion of the ferroelectric layer is positioned between the at least one bit line and the plurality of word lines;
the ferroelectric layer positioned between the at least one bit line and each word line of the plurality of word lines forms a memory cell; and
each memory cell is individually addressable through two of the concentric, endless contact lines.

3. The memory device of claim 1, wherein the plurality of concentric, endless contact lines are a plurality of circular concentric, endless contact lines.

4. The memory device of claim 1, further comprising a printed circuit board (PCB) substrate that comprises the electrical insulator region, wherein the printed circuit is positioned on a first side of the PCB substrate and on a second side of the PCB substrate.

5. The memory device of claim 4, wherein the plurality of contact pads are electrically coupled to a plurality of landing pads on the first side of the PCB substrate.

6. The memory device of claim 5, wherein the plurality of concentric, endless contact lines are positioned on the second side of the PCB substrate and are electrically coupled to the plurality of landing pads with a plurality of vias that extend through a thickness of the PCB substrate and a plurality of traces positioned on the first side of the PCB substrate.

7. The memory device of claim 1, wherein each of the plurality of concentric, endless contact lines comprises a shape selected from circular, oval, a smooth polygon, triangular, square, rectangular, pentagonal, star-shaped, or from three-sided to twenty-sided.

8. An electronic system for identifying an article, comprising:
a printed memory comprising a substrate, a plurality of contact pads overlying the substrate, a plurality of wiring lines electrically coupled to the plurality of contact pads, and ferroelectric layer overlying the substrate;
a printed circuit comprising a plurality of concentric, endless contact lines electrically coupled to the plurality of contact pads wherein, at least in plan view, each of the plurality of concentric, endless contact lines encloses an electrical insulator region; and
a reader configured to perform a memory operation on the printed memory, the reader having a read head comprising a plurality of contact probes for physically and electrically contacting the plurality of concentric, endless contact lines.

9. The electronic system of claim 8, wherein the plurality of concentric, endless contact lines are a plurality of circular concentric, endless contact lines.

10. The electronic system of claim 8, further comprising:
a printed circuit board (PCB) substrate comprising a first side and second side opposite the first side, wherein the second side comprises the electrical insulator region and the plurality of concentric, endless contact pads are positioned on the second side; and
a plurality of landing pads positioned on the first side of the PCB substrate, wherein the plurality of contact pads are physically and electrically coupled to the plurality of landing pads.

11. The electronic system of claim 10, further comprising:
a plurality of vias that extend through a thickness of the PCB substrate; and
a plurality of traces electrically coupled to the plurality of landing pads and the plurality of vias,
wherein the plurality of concentric, endless contact lines are electrically coupled to the plurality of landing pads by the plurality of vias and the plurality of traces.

12. The electronic system of claim 11, wherein:
the reader further comprises a contoured casing configured to match a shape of the article; and
the read head is mounted to the casing.

13. The electronic system of claim 11 wherein, during a memory operation on the printed memory, a first center of the PCB substrate is axially aligned with a second center of the read head.

14. The electronic system of claim 13, further comprising a plurality of dimples positioned on one of the PCB substrate and the read head and a plurality of detents positioned on the other of the PCB substrate and the read head, wherein the plurality of dimples and the plurality of detents are configured for the axially aligning of the first center of the PCB substrate with the second center of the read head.

15. The electronic system of claim 13, further comprising a first magnet positioned at the first center of the PCB substrate and a second magnet positioned at the second center of the read head, wherein the first magnet and the second magnet are configured for the axially aligning of the first center of the PCB substrate with the second center of the read head.

16. The electronic system of claim 13, wherein:
the plurality of concentric, endless contact lines are a plurality of circular concentric, endless contact lines; and
the electronic system is configured to perform the memory operation using the read head irrespective of a rotational orientation of the read head relative to the printed memory around the second center of the read head.

17. A method of performing a memory operation on a printed memory, comprising:

physically and electrically contacting a plurality of endless, concentric contact lines with a plurality of contact probes of a reader;

initiating the memory operation using the reader; and placing a voltage across a bit line and a word line of the printed memory using the reader to perform the memory operation on a ferroelectric layer positioned between the bit line and the word line, wherein an electric charge applied to the printed memory by the reader extends through an electrical pathway formed by the plurality of contact probes, the plurality of endless, concentric contact lines, a plurality of vias electrically coupled to the plurality of endless, concentric contact lines, a plurality of traces electrically coupled to the plurality of vias, a plurality of landing pads electrically coupled to the plurality of traces, a plurality of contact pads of the printed memory, the bit line, and the word line.

18. The method of claim 17, wherein:
the plurality of vias extend through a thickness of a printed circuit board (PCB) substrate;
the plurality of landing pads are positioned on a first side of the PCB substrate; and
the plurality of endless, concentric contact lines are positioned on a second side of the PCB substrate.

19. The method of claim 17, wherein the plurality of contact probes are configured to physically contact the plurality of endless, concentric contact lines at any rotational orientation relative to the printed memory to result in a successful memory operation being performed on the printed memory by the reader.

20. The method of claim 17 wherein, at least in plan view, each of the plurality of concentric, endless contact lines encloses an electrical insulator region.

* * * * *